(12) United States Patent
Hsieh

(10) Patent No.: US 12,288,582 B2
(45) Date of Patent: Apr. 29, 2025

(54) SEMICONDUCTOR MEMORY DEVICE AND METHOD FOR COMPENSATING SLEW RATE USING IMPEDANCE CALIBRATION

(71) Applicant: Winbond Electronics Corp., Taichung (TW)

(72) Inventor: Chia-Lung Hsieh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 148 days.

(21) Appl. No.: 18/306,987

(22) Filed: Apr. 25, 2023

(65) Prior Publication Data

US 2024/0296880 A1 Sep. 5, 2024

(30) Foreign Application Priority Data

Mar. 2, 2023 (TW) ................................. 112107536

(51) Int. Cl.
*G11C 16/04* (2006.01)
*G11C 11/4093* (2006.01)

(52) U.S. Cl.
CPC ............................... *G11C 11/4093* (2013.01)

(58) Field of Classification Search
CPC .................................................. G11C 11/4093
See application file for complete search history.

(56) References Cited

U.S. PATENT DOCUMENTS

| | | | |
|---|---|---|---|
| 7,171,321 B2* | 1/2007 | Best | G11C 11/4076 365/194 |
| 7,602,859 B2 | 10/2009 | Cheng et al. | |
| 2004/0105317 A1* | 6/2004 | Shibata | H03K 19/00384 365/189.11 |
| 2023/0080033 A1* | 3/2023 | Iorga | H03K 3/0232 327/227 |

* cited by examiner

*Primary Examiner* — Pho M Luu
(74) *Attorney, Agent, or Firm* — JCIPRNET

(57) ABSTRACT

A semiconductor memory device having a capability of adjusting slew rate of data voltage signals generated by output buffers having different PVT characteristics based on ZQ calibration signal is provided. The semiconductor memory device includes a memory, a calibration counter, a slew rate (SR) control circuit and an output buffer. The calibration counter receives a ZQ calibration signal and generates a SR calibration signal based on the ZQ calibration signal. The memory is coupled to the SR control circuit. The SR control circuit is coupled to the output buffer and the calibration counter, and configured to receive the SR calibration signal from the calibration counter. The output buffer is configured to generate a data voltage signal according to data obtained from the memory and perform a slew rate control on the data voltage signal based on the SR calibration signal.

10 Claims, 4 Drawing Sheets

SEMICONDUCTOR MEMORY DEVICE AND METHOD FOR COMPENSATING SLEW RATE USING IMPEDANCE CALIBRATION

CROSS-REFERENCE TO RELATED APPLICATION

This application claims the priority benefit of Taiwan application serial no. 112107536, filed on Mar. 2, 2023. The entirety of the above-mentioned patent application is hereby incorporated by reference herein and made a part of this specification.

BACKGROUND

Technical Field

The disclosure generally relates to a semiconductor memory device and an operation method thereof, and more specifically, a semiconductor memory device and a method thereof for compensating a slew rate of data voltage signal by using ZQ calibration signal.

Description of Related Art

The output buffer of double data rate (DDR) memory needs to meet the rating of DC and AC specification, and the size of the output buffer has been determined in the DC stage. Therefore, an output slew rate (SR) control circuit is needed to control slew rate of data voltage signal. Excessive output slew rate at high voltage and fast corners may affect the EMI measurement results on the system. Alternatively, small output slew rate at low voltage and slow corners would result in in data valid window attenuation.

Although the output buffer is affected by the corners of process, voltage, and temperature (PVT) characteristic which causes variations in driving strength, in DDR3, ZQ calibration (ZQ Calibration) has been used to reduce the variation of driving strength. However, the slew rate control circuit for adjusting the slew rate of the data voltage signal is still affected by different corners of PVT characteristics. Therefore, how to reducing the delay time within the SR control circuit is one of the problems to be solved.

SUMMARY

The disclosure introduces a semiconductor memory device having a capability of adjusting slew rate of data voltage signals being generated by output buffers having different PVT characteristics based on ZQ calibration signal.

The disclosure provides a semiconductor memory device that includes a memory, a calibration counter, a slew rate control circuit and an output buffer. The calibration counter receives a ZQ calibration signal and generates a SR calibration signal based on the ZQ calibration signal. The slew rate (SR) control circuit is coupled to the output buffer and the calibration counter, and configured to receive the SR calibration signal from the calibration counter. The output buffer is coupled between the memory and the SR control circuit, and configured to provide a data voltage signal to perform accessing operation to the memory and perform a slew rate control on the data voltage signal based on the SR calibration signal.

The disclosure provides a method of slew rate control for adjusting the slew rate of data voltage signals being generated by output buffers having different PVT characteristics. The method includes the following steps: obtaining a ZQ calibration signal for impendence compensation; determining whether to perform a slew rate adjustment on a data voltage signal based on the ZQ calibration signal; outputting a slew rate calibration signal to adjust the slew rate of the data voltage signal; and outputting the data voltage signal based on the slew rate calibration signal and the ZQ calibration signal to a memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
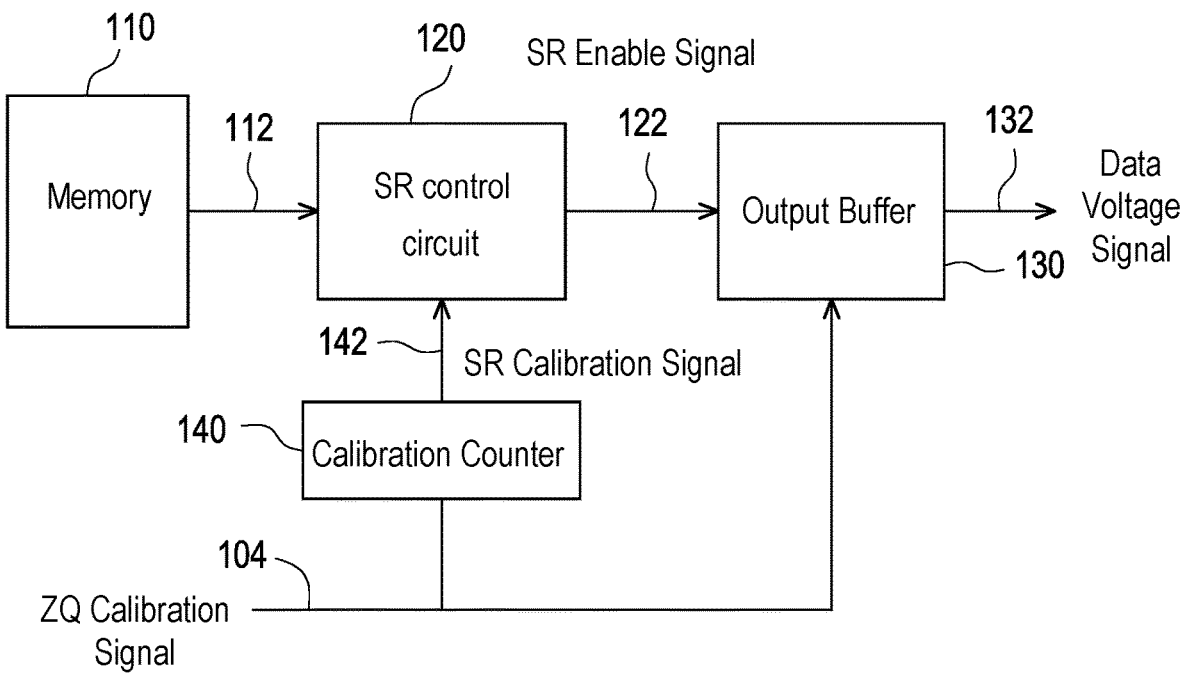
FIG. 1 is a diagram illustrating a memory device according to some embodiments of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram illustrating a memory device 100 according to some embodiments of the disclosure. With reference to FIG. 1, the memory device 100 includes a memory 110, a slew rate (SR) control circuit 120, an output buffer 130, and a calibration counter 140. The SR control circuit 120 is coupled to the memory 110, the output buffer 130 and calibration counter 140. The SR control circuit 120 respectively receives the memory data 112 and a SR calibration signal 142, and then generate a SR enable signal 122 based on the SR calibration signal 142, as to output a data voltage signal 132 (also referred to as output data) corresponding to the memory data 112. In the embodiment, the memory data 112 is read from the memory 110 and output by the out buffer 130 as the data voltage signal 132. The SR calibration signal 142 is used to control the slew rate of the data voltage signal 132 output by the output buffer 130 (which may also be referred to as an output slew rate).

The output buffer 130 is coupled to the memory 110 as to read the data voltage signal 132. The output buffer 130 receives the ZQ calibration signal 104. The ZQ calibration signal 104 may be used to compensate the impedance of the output buffer 120 which is caused by the PVT variations (also referred to as PVT characteristics). For example, the ZQ calibration signal 104 may be used to tune the output buffer 130 and on dies termination (ODT) values by adjusting pull-up and pull-down resistors (not shown) of the memory device 100 across changes in process, voltage and temperature (PVT) values. Because PVT characteristics may impact the ZQ resistor values (impedance), the ZQ calibration signal 104 may be provided to be used to adjust the resistance to calibrate the input impedance to known values. The ZQ calibration signal 104 reflects the influences caused by the PVT variations which may be predetermined based on the specification of the chip from the manufacture. The above description only describes an implementation of ZQ calibration, however, the disclosure is not intended to limit the implementation of the ZQ calibration.

The memory 110 includes a plurality of memory banks, each memory banks includes a plurality of memory cells arranged in an array. In the embodiments, the memory 110 may be implemented with dynamic random access memory (DRAM), static random access memory (SRAM), or any other types of memories including those that do not need to be refreshed. The memory 110 may include multiple channels of memory devices such as synchronous DRAMs (SDRAMs). The SDRAMs may be Double Data Rate (DDR). The disclosure is not intended to limit the type of the memory. In some embodiments, each memory bank may be coupled to a corresponding output buffer 130 through a memory bank controller (not shown).

In the embodiments, the SR control circuit 120 controls the output slew rate by controlling the timing for generating the data voltage signal 132 in the output buffer 130. In other words, the output slew rate may be adjusted by adjusting the delay times within the SR control circuit 120. Due to the PVT variations, the delay time for enabling the output buffer 130 may also be affected. Since the SR control circuit 120 shares the similar PVT characteristics as the transistors in the output buffer 130, the ZQ calibration signal 104 which is used to adjust the impedance of the output buffer 130 may also be used to adjust the delay time for enabling the output buffer 130, so as to adjust the output slew rate. Therefore, the disclosure further utilizes the ZQ calibration signal 104 to calibrate the delay time of the SR control circuit 120, as to calibrate the output slew rate of the output buffer 130. For example, the calibration counter 140 receives the ZQ calibration signal ZQ and generates a slew rate (SR) calibration signal 142 based on the ZQ calibration signal 104. The SR calibration signal 142 is provided to SR control circuit 120 to adjust the delay time for enabling the output buffer 130, and accordingly, the output slew rate may be calibrated to compensate the PVT variations.

In the embodiments, the calibration counter 140 utilizes the ZQ calibration to anticipate the PVT variations on the semiconductor memory device 100, so as to adjust the slew rate of the data voltage signal 132. For example, based on PVT characteristic, components of the semiconductor memory device may be characterized in PVT corners such as typical-typical (TT) corner, fast-fast (FF) corner, and slow-slow (SS) corner. Each corner may be characterized to have different delay times, impedances, driving capability, etc. due to the PVT variations. While the ZQ calibration signal 104 is input to output buffer 130 to compensate the impedance caused by PVT variation, the ZQ calibration signal 104 is also input to the calibration counter 140 to adjust the delay time for enabling the output buffer 130. For example, in one of the embodiments, the ZQ calibration technique applied in the third generation DDR (DDR3) is utilized to reduce the delay time of the SR control circuit under different PVT corners when the driving strength of the output buffer 130 is increased. On the other hand, the delay time of the SR control circuit may be increased (extended) as the driving strength of the output buffer 130 is reduced based on the ZQ calibration signal. Accordingly, the ZQ calibration signal may be used to calibrate the output slew rate.

In one of the embodiments, the FF and SS corners are adjusted based on a predetermined threshold. For example, the ZQ calibration signal 104 may include a delay time on the transistors of the output buffer (or memory cells) characterized in the SS corner or FF corner. The delay time extracted from the ZQ calibration signal 104 may be compared to a predetermined threshold as to determine whether to increase or decrease the delay time. The adjustment of the delay time may be an increment or decrement in predetermined level(s). Each level of adjustment may set based on the capability of adjustment such as the minimum amount of time adjustment based on the hardware capability (e.g., delay times in nanosecond, microsecond, picosecond, etc.) In some embodiments, the SR control operation would only be enabled if the level of adjustment as determined by using the ZQ calibration signal 104 is n levels or above, where n is greater than 1. In such case, the adjustment on the output slew rate would be (n−1) levels. In some other embodiments, the predetermined threshold may be set with respect to the TT corner so that the semiconductor components characterized in the TT, FF, and SS corners may be operated upon based on data voltage signals having similar slew rates. That is, the variations in the slew rates of the data voltage signals output by the output buffers characterized in different PVT corners may be reduced.

Figure 2:
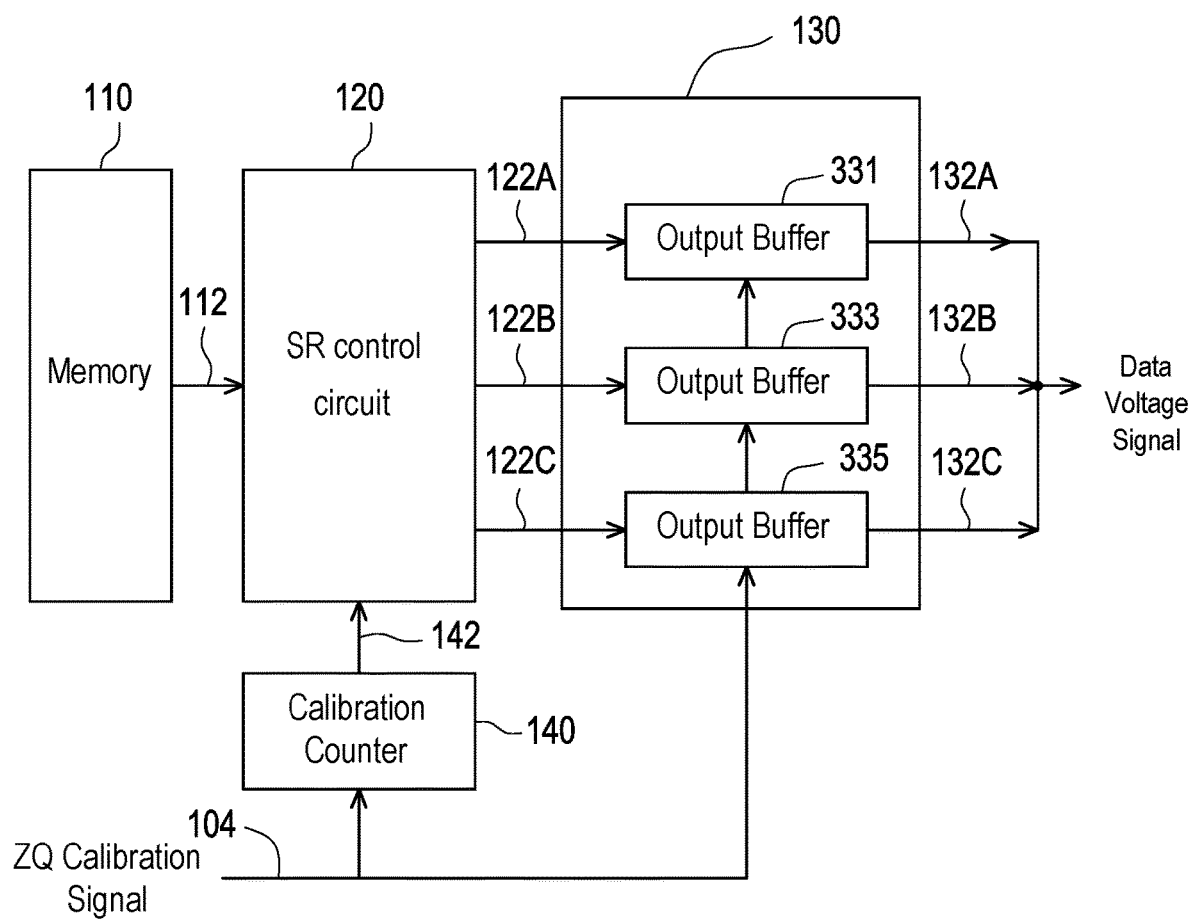
FIG. 2 is a diagram illustrating a memory device according to some embodiments of the disclosure.

FIG. 2 is a diagram illustrating a memory device 200 according to some embodiments of the disclosure. With reference to FIG. 2, the output buffer 130 of FIG. 1 may include three output buffers 331, 333, 335 which are respectively coupled to different sets of memory cells (or memory banks). For the purpose of illustration, the output buffer 331 may have PVT characteristic of TT corner, the output buffer 333 may have PVT characteristic of FF corner, and the output buffer 335 may have PVT characteristic of SS corner. In the embodiments, the ZQ calibration signal 104 are input to the output buffers 331, 333, 335, respectively, as to compensate for the PVT variations of the output buffers 331, 333, 335. The calibration counter 140 also receives the ZQ calibration signal 104 and generates the SR calibration signals 142. According to the SR calibration signal 142, the SR control circuit 120 generates SR enable signals 122A, 122B, 122C and respectively outputs the SR enable signals 122A, 122B, 122C to the output buffers 331, 333, 335, as to adjust the output slew rate of the corresponding output buffer. Accordingly, the output buffers 331, 333, 335 characterized in different corners of PVT characteristic may generate the data voltage signals 132A, 132B, 132C having similar slew rates. As result, in the embodiment, the deviations between the output slew rate of the output buffers characterized in different corners may be reduced.

In the following, tables 1 and 2 are provided to illustrate the disclosure according to some embodiments. Table 1 illustrates the output slew rate (e.g., V/ns) of the data voltage signals for different PVT corners (e.g., TT, SS, FF corners) and maximum variation between the slew rates of the data voltage signals before the slew rate adjustment performed by the calibration counter 140. Table 2 illustrates the output slew rate of the data voltage signals for different corners after the slew rate adjustment performed by the calibration counter 140 based on the ZQ calibration signal 104. For example, the slew rate of the data voltage signal at the SS corner may be increased, for example, from 2.43 V/ns to 3.4 V/ns. The adjustment of the slew rate may be performed by decreasing the delay time of the SR control circuit from, for example, 215 picosecond (ps) to 150 ps. The slew rate of the data voltage signal at the FF corner may be reduced, for example, from 5.05 V/ns to 3.44 V/ns. The adjustment may be performed by increasing the delay time of the SR control circuit from, for example, 107 ps to 148 ps. In the embodiments, the slew rate of the data voltage signal at the TT corner remains the same. In other words, the slew rate adjustment is performed to the output buffers corresponding the SS corner and FF corner with respect to the TI corner. As the result, the variation in the slew rates of the data voltage signals 132A, 132B. 132C provided by the output buffers 331, 333, 335 may be reduced. In the example as illustrated in tables 1 and 2, the variation in the slew rate is reduced from 2.62 V/ns to 0.04 V/ns. It should be noted that the values as illustrated in the tables 1 and 2 are for the illustration purpose only, and it is not intended to limit the values, capability of the adjustment, variation between the slew rates of different corners, etc.

TABLE 1 slew rate of the data voltage signal before slew rate adjustment

| Corner | Output SR | Variation |
|---|---|---|
| TT | 3.4 | 2.62 |
| SS | 2.43 | |
| FF | 5.05 | |

TABLE 2 slew rate of the data voltage signal after slew rate adjustment

| Corner | Output SR | Variation |
|---|---|---|
| TT | 3.4 | 0.04 |
| SS | 3.4 | |
| FF | 3.44 | |

In the embodiments, the slew rate of the data voltage signal at the TT corner is not adjusted, however, the disclosure is not limited thereto. In some other embodiments, the slew rate of the data voltage signal generated by the output buffers having PVT characteristic of TT, FF, SS corners (as well as FS and SF corners) may be adjusted based on design requirements. For example, the slew rate of data voltage signal at TT, FF, SS corners may all be adjusted to a predetermined slew rate based on design requirements. In some other embodiments, the adjustment of the slew rate at the SS and FF corners may be performed based the characteristic of the TT corner.

Figure 3:
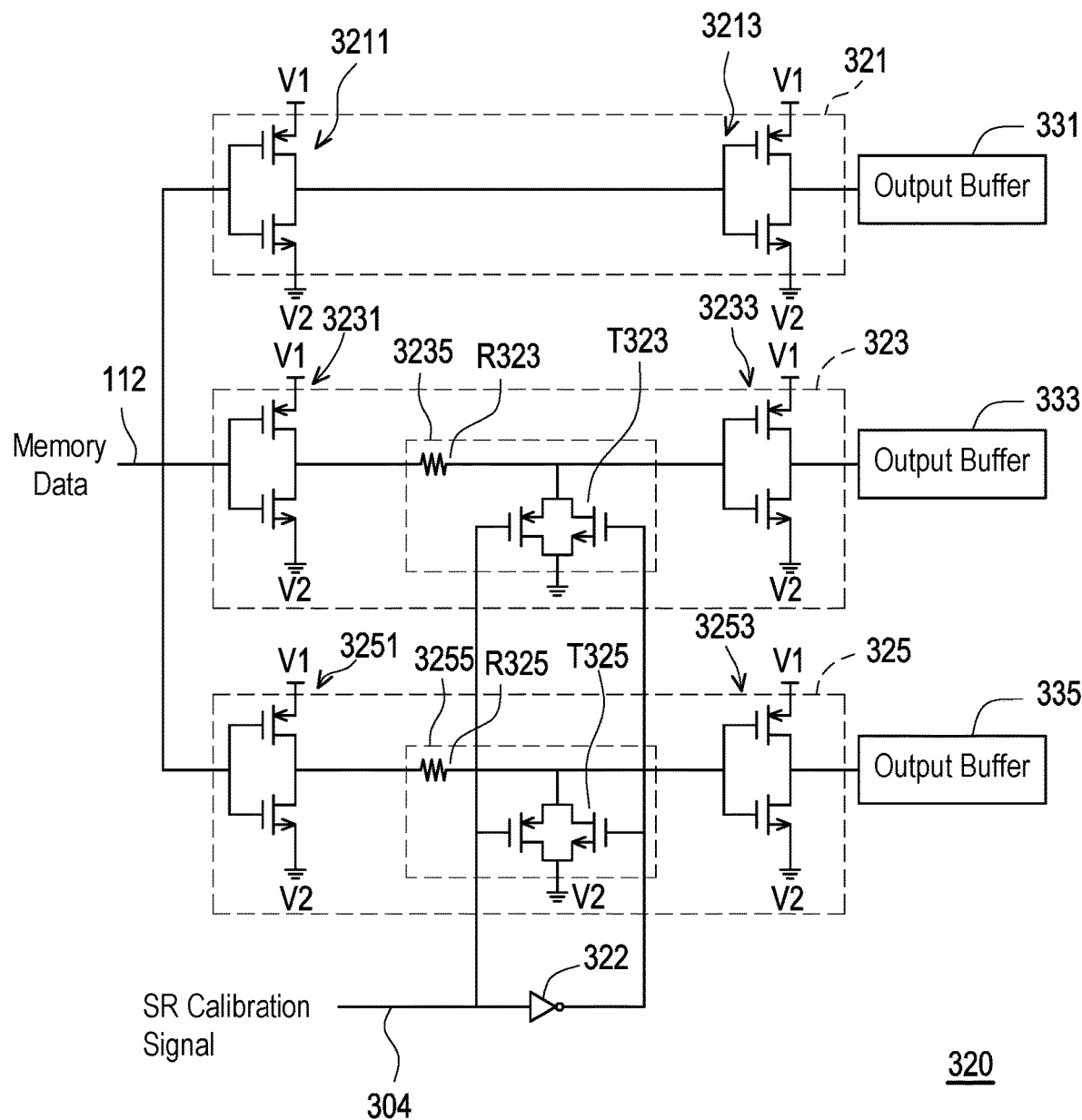
FIG. 3 is a circuit diagram illustrating a slew rate control circuit according to some embodiments of the disclosure.

FIG. 3 is a circuit diagram illustrating a slew rate control circuit 320 according to some embodiments of the disclosure. In the embodiments, the slew rate control circuit 320 includes three amplifiers 321, 323, 325. The amplifiers 321, 323, 325 are respectively coupled to the output buffers 331, 333, 335 for adjusting the slew rate of the corresponding data voltage signals. For example, the amplifier 321 is coupled to the output buffer 331 having a PVT characteristic of TT corner. The amplifier 323 is coupled to the output buffer 333 having a PVT characteristic of SS corner. The amplifier 325 is coupled to the output buffer 335 having a PVT characteristic of FF corner. Each of the amplifiers 321, 323, 325 includes an input stage inverter and an output stage inverter connected in series. For example, the amplifier 321 includes an input stage inverter 3211 and an output stage inverter 3213. The amplifier 323 includes an input stage inverter 3231 and an output stage inverter 3233. The amplifier 325 includes an input stage inverter 3251 and an output stage inverter 3253. Each inverter includes a p-type metal-oxide semiconductor (PMOS) transistor and a n-type MOS transistor connected in series between a first supply voltage V1 and a second supply voltage V2, where the first supply voltage V1 has a higher potential with respect to the second supply voltage V2. In some embodiment, the first supply voltage V1 may be a supply power having positive potential, and the second supply voltage V2 may be a ground. However, the disclosure is not limited thereto.

In the embodiments, the output slew rate of the output buffers having PVT characteristic of SS and FF corners are adjusted based on the ZQ calibration signal 104. Each of the amplifiers 323, 325 further includes a RC delay circuit 3235, 3255 which receives the output SR calibration signal 304 from the calibration counter 140. In the embodiments, the RC delay circuit 3235 (3255) is coupled between the input stage inverter 3231 (3251) and the output stage inverter 3233 (3253) of the amplifier 323 (325). The SR calibration signal 304 is generated based on the ZQ calibration signal 104, where the ZQ calibration signal 104 specifies the PVT characteristic of the corresponding output buffer is coupled. In the embodiments, the amplifier 323 is coupled to the output buffer 333 to control or adjust the slew rate of the data voltage signal output by the output buffer 333 (which may be referred to as output SR control operation). The amplifier 325 is coupled to the output buffer 335 to control or adjust the slew rate of the data voltage signal output by the output buffer 335 (i.e., output SR control operation)

The output slew rate control is performed by using the RC delay circuits 3235, 3255. Each of the RC delay circuits 3235, 3255 respectively includes a resistor $R_{323}$, $R_{325}$ and a transmission gate $T_{323}$, $T_{325}$. The resistor $R_{325}$ is coupled between the input stage inverter 3231 and the output stage inverter 3233 of the amplifier 323. The transmission gate $T_{323}$ is coupled between the second supply voltage V2 and an intersection between the resistor $R_{323}$ and the output stage inverter 3233 of the amplifier 323. The resistor $R_{325}$ is coupled between input stage inverter 3251 and the output stage inverter 3253 of the amplifier 325. The transmission gate $T_{325}$ is coupled between the second supply voltage V2 and an intersection between the resistor $R_{325}$ and the output stage inverter 3253 of the amplifier 325. Each of the transmission gates $T_{323}$, $T_{325}$ includes two control terminals that are respectively coupled to the SR calibration signal 304 and a complementary of the SR calibration signal 304. The complementary of the SR calibration signal 304 is obtained through an inverter 322 coupled to the SR calibration signal 304. Based on the SR calibration signal 304, the amplifier 323, 325 may adjust (i.e., increase or reduce) the output slew rate of the data voltage signal based on the PVT characteristic reflected by the ZQ calibration signal 104. In some other embodiments, the amplifier 321 which is coupled to the output buffer 331 having characteristic of TT corner, may also include a RC delay circuit similar to the RC delay circuits 3235, 3255. As such, the slew rate of the data voltage signal that is to be generated by the output buffer 331 characterized in TT corners may also be adjusted based on the SR calibration signal 304.

Figure 4:
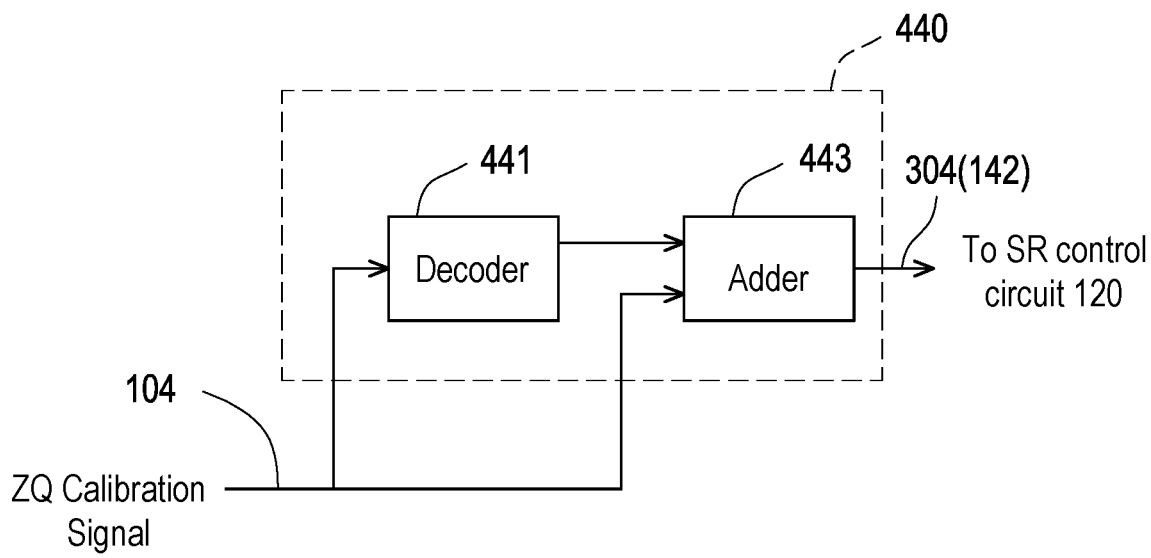
FIG. 4 is a diagram illustrating a calibration counter according to some embodiments of the disclosure.

FIG. 4 is a diagram illustrating a calibration counter 440 according to some embodiments of the disclosure. In the embodiments, the calibration counter 440 includes a decoder 441 and an adder 443. The decoder 441 decodes the ZQ calibration signal 104 (e.g., ZQ code) as to determine the PVT characteristics reflected in the ZQ calibration signal 104. Then, the output of the decoder 441 is added to the ZQ calibration signal 104 through the adder 443. The sum of the decoder 441 and the ZQ calibration signal 104 is output as the SR calibration signal 142 and transmitted to the SR control circuit 120, 320 as illustrated in FIGS. 1 and 3, where the SR control circuit 120, 320 generates and outputs SR enable signal(s) based on the SR calibration signal 142. In the embodiment illustrated in FIG. 3, the SR calibration signal 304 is input to the amplifiers 323, 325 and controls the RC delay circuits 3235, 3255, as to adjust the output slew rate of the output buffers 333, 335. In the embodiments, the amount of adjustment (increase or decrease) may be determined by the ZQ calibration signal 104. For example, the decoder 441 may store predetermined relationships between PVT characteristics and adjustment values. The PVT characteristics may be obtained from the ZQ calibration signal 104. For example, the PVT characteristics may include delay time of different corners, etc. The decoder 441 may acquire a desired adjustment value corresponding to the PVT characteristic as indicated by the ZQ calibration signal 104 from the predetermined relationship. The desired adjustment value may be added to the originally received ZQ calibration signal 104 by the adder 443, and the sum may be output to the SR control circuit 120 (as the SR calibration signal 142) for adjusting the output slew rate of the corresponding output buffers. In some embodiment, the predetermined relationship may be stored as a lookup table, however, the disclosure is not limited thereto. In some embodiments, the RC delay circuits 3235, 3255 in the SR control circuits 120 may be activated based on the SR calibration signal 304 (or 142). For example, when the delay time as indicated by the PVT characteristic is less or greater than a predetermined threshold with respect to a desired slew rate, the RC delay circuits 3235, 3255 is configured to increase or decrease the delay time for enabling the corresponding output buffers, respectively.

Figure 5:
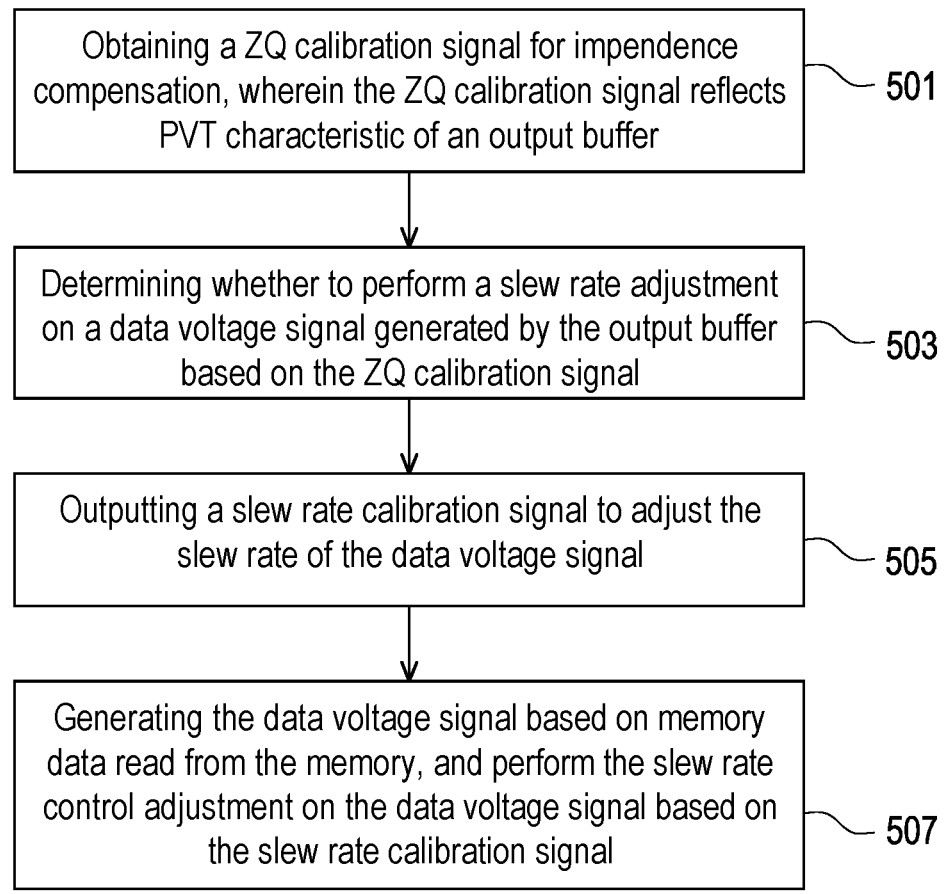
FIG. 5 is a flow diagram illustrating a method for adjusting a slew rate of an output buffer according to some embodiments of the disclosure.

FIG. 5 is a flow diagram illustrating a method for adjusting or compensating a slew rate of an output buffer according to some embodiments of the disclosure. In the embodiments, the ZQ calibration signal is obtained (S501). In step S503, the calibration counter determines whether to perform an adjustment on a slew rate of data voltage signal based on the ZQ calibration signal. As described above, the ZQ calibration signal reflects the PVT characteristics which influence the slew rate of the data voltage signal generated by the output buffer. Accordingly, a SR control operation may be performed to compensate the slew rate of the data voltage signal affected by different corners of the PVT characteristic, so as to minimize the variation between the slew rates of the data voltage signal generated by output buffer characterized in different corners. For example, the ZQ calibration signal may be compared to a desired threshold. If the ZQ calibration signal is less or greater than the desired threshold by n levels, the calibration counter may be activated to output a SR calibration signal to a SR control circuit (step S505). According to the SR calibration signal, the SR control circuit adjust the slew rate of the data voltage signal by outputting a SR enable signal to the corresponding output buffer, so as to minimize the variation of the slew rates of the data voltage signal generated by the output buffers characterized in different corners of the PVT characteristic (step S507).

The semiconductor memory device as illustrated in the above embodiments and the method thereof is configured to perform an adjustment or compensation on slew rate of data voltage signal generated by output buffer having different PVT characteristics according to ZQ calibration signal. For example, in one of the embodiments, delay time of a slew rate control circuit is calibrated by using the ZQ calibration signal, so as to calibrate the slew rate of the output buffer. In one of the embodiments, the delay time of the SR control circuit is reduced when the slew rate of the output buffer is high. On the other hand, the delay time of the SR control circuit is increased when the slew rate of the output buffer is low. Based on the above, the calibration of the slew rate of the output buffer is achieved, as to reduce the differences between the slew rate of different output buffers having different PVT characteristics.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor memory device, comprising:
    a memory;
    a calibration counter, receiving a ZQ calibration signal and generating a slew rate (SR) calibration signal based on the ZQ calibration signal;
    a SR control circuit, coupled to the calibration counter, and configured to receive the SR calibration signal from the calibration counter to generate an SR enable signal; and
    an output buffer, coupled to the memory and the SR control circuit, and configured to provide a data voltage signal based on memory data read from the memory, and perform a SR control operation based on the SR enable signal.

2. The semiconductor memory device of claim 1, wherein the output buffer has a characteristic of SS corner or FF corner of PVT.

3. The semiconductor memory device of claim 1, wherein the calibration counter comprises:
    a decoder, configured to decode the ZQ calibration signal; and
    an adder, configured to sum the decoded ZQ calibration signal to the ZQ calibration signal and output a result of the sum as the SR calibration signal to the SR control circuit.

4. The semiconductor memory device of claim 3, wherein the decoder is configured to obtain a slew rate adjustment value corresponding to the received ZQ calibration signal from a predetermined relationship between PVT characteristics and slew rates.

5. The semiconductor device of claim 1, wherein the output buffer is further configured to receive the ZQ calibration signal to perform an impedance calibration.

6. The semiconductor device of claim 1, wherein the output buffer comprises:
   a first output buffer, coupled to a first portion of memory having a first PVT characteristic; and
   a second output buffer, coupled to a second portion of memory having a second PVT characteristic different from the first PVT characteristic,
   wherein the slew rate control circuit comprises:
   a first amplifier, coupled to the first output buffer; and
   a second amplifier, coupled to the second output buffer, and configured to adjust a slew rate of data voltage signal provided by the second output buffer based on a delay time of the first output buffer characterized by the ZQ calibration signal.

7. The semiconductor memory device of claim 6, wherein the second amplifier comprises:
   an input stage inverter, configured to receive a data voltage signal corresponding to a second portion of the memory,
   an output stage inverter; and
   a RC delay circuit, coupled between the input stage inverter and output stage inverter, and configured to receive the SR calibration signal.

8. The semiconductor memory device of claim 7, wherein the RC delay circuit comprises a resistor and a transmission gate, and the transmission gate is coupled to the SR calibration signal.

9. The semiconductor device of claim 6, wherein the slew rate control circuit is configured to adjust the slew rate of a second data voltage signal corresponding to the second portion of the memory and generated by the second output buffer based on the ZQ calibration signal, so that a variation between a slew rate of a second data voltage signal corresponding to the second portion of the memory and the slew rate of a first data voltage signal corresponding to the first portion of the memory is reduced.

10. A method of slew rate control, for compensating a slew rate of a data voltage signal being generated by an output buffer, comprising:
   obtaining a ZQ calibration signal for impendence compensation, wherein the ZQ calibration signal reflects PVT characteristic of an output buffer;
   determining whether to perform a slew rate adjustment on a data voltage signal generated by the output buffer based on the ZQ calibration signal;
   outputting a slew rate calibration signal to adjust the slew rate of the data voltage signal; and
   generating the data voltage signal based on memory data read from the memory, and perform the slew rate control adjustment on the data voltage signal based on the slew rate calibration signal.

* * * * *